United States Patent [19]
Sugiyama et al.

[11] Patent Number: 6,060,743
[45] Date of Patent: May 9, 2000

[54] SEMICONDUCTOR MEMORY DEVICE HAVING MULTILAYER GROUP IV NANOCRYSTAL QUANTUM DOT FLOATING GATE AND METHOD OF MANUFACTURING THE SAME

[75] Inventors: Naoharu Sugiyama; Tsutomu Tezuka; Riichi Katoh, all of Yokohama; Atsushi Kurobe, Yamato; Tetsufumi Tanamoto, Kawasaki, all of Japan

[73] Assignee: Kabushiki Kaisha Toshiba, Kawasaki, Japan

[21] Appl. No.: 09/082,613

[22] Filed: May 20, 1998

[30] Foreign Application Priority Data

May 21, 1997 [JP] Japan ..................................... 9-131014
May 21, 1997 [JP] Japan ..................................... 9-131016

[51] Int. Cl.$^7$ ........................ H01L 29/788; H01L 29/06; H01L 29/15; H01L 21/336
[52] U.S. Cl. ............................... 257/321; 257/9; 257/12; 257/14; 257/15; 257/17; 257/20; 257/24; 257/30; 257/314; 257/315; 257/317; 438/197; 438/201; 438/257; 438/264; 438/962
[58] Field of Search ................... 257/9, 12, 17, 257/20, 23, 24, 30, 14, 15, 314, 315, 317, 321, 324, 325; 438/197, 201, 257, 263, 264, 962

[56] References Cited

U.S. PATENT DOCUMENTS

| | | | |
|---|---|---|---|
| 5,600,163 | 2/1997 | Yano et al. | 257/314 |
| 5,663,571 | 9/1997 | Ugajin | 257/17 |
| 5,670,790 | 9/1997 | Katoh et al. | |
| 5,679,962 | 10/1997 | Kizuki | 257/17 |
| 5,714,766 | 2/1998 | Chen | 257/17 |
| 5,719,407 | 2/1998 | Ugajin | 257/21 |
| 5,731,598 | 3/1998 | Kado et al. | 257/30 |
| 5,811,832 | 9/1998 | Alphenaar et al. | 257/25 |
| 5,905,273 | 5/1999 | Hase et al. | 257/24 |

FOREIGN PATENT DOCUMENTS

| | | |
|---|---|---|
| 8-78669 | 3/1996 | Japan . |
| 8-139209 | 5/1996 | Japan . |
| 9-116106 | 5/1997 | Japan . |
| 9-140279 | 6/1997 | Japan . |

OTHER PUBLICATIONS

Yano et al., Room Temperature Single Electron Memory, IEEE Transactions on Electron Devices, vol. 44, No. 9, Sep. 1994.
Guo et al., Si Single Electron MOS Memory with Nanoscale Floating Gate and Narrow Channel, IEDM 1996 pp955,956.
A. Nakajima et al., "Room temperature operation of Si single–electron with self–aligned floating dot gate", Appl. Phys. Lett., 70(13):1742–1744 (1997).
A. Nakajima et al., "Si Quantum dot formation with Low–Pressure Chemical Vapor Deposition", Jpn. J. Appl. Phys., 35(2B):L189–L191, Part 2, (1996).
S. Tiwari et al., "A silicon nanocrystals based memory", Appl. Phys. Lett., 68(10):1377–1379 (1996).

*Primary Examiner*—David Hardy
*Assistant Examiner*—Bradley William Baumeister
*Attorney, Agent, or Firm*—Finnegan, Henderson, Farabow, Garrett & Dunner, L.L.P.

[57] ABSTRACT

The semiconductor device comprises a first insulating layer formed on the semiconductor substrate, at least one double-deck semiconductor nanocrystal formed on the first insulating layer, the at least one double-deck semiconductor nanocrystal comprising a first semiconductor nanocrystal and a second semiconductor nanocrystal stacked one upon the other via a second insulating layer, and a third insulating layer selectively formed on the first insulating layer so as to cover the at least one double-deck semiconductor nanocrystal.

13 Claims, 11 Drawing Sheets

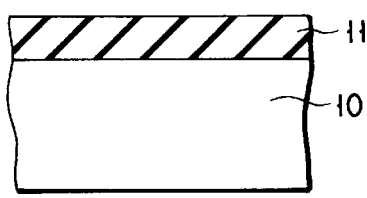
FIG. 1A
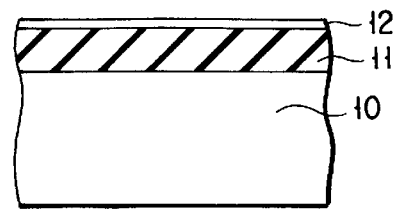
FIG. 1B
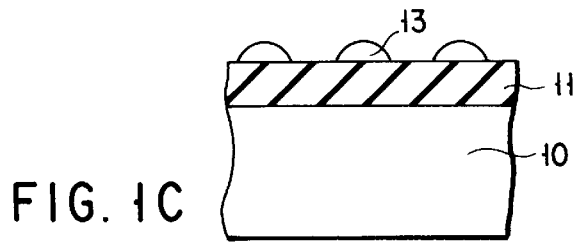
FIG. 1C
| INITIAL THICKNESS OF AMORPHOUS LAYER (nm) | ANNEALING CONDITION | | SIZE OF NANOCRYSTAL | |
|---|---|---|---|---|
| | TEMPERATURE (°C) | TIME (min) | DIAMETER (nm) | HEIGHT (nm) |
| 0.5 | 730 | 5 | 5 | 2 |
| 1 | 800 | 3 | 10 | 5 |
| 2 | 830 | 3 | 30 | 15 |
| 5 | 850 | 5 | 50 | 25 |
FIG. 2A
| INITIAL THICKNESS OF AMORPHOUS LAYER (nm) | ANNEALING CONDITION | | SIZE OF NANOCRYSTAL | |
|---|---|---|---|---|
| | TEMPERATURE (°C) | TIME (min) | DIAMETER (nm) | HEIGHT (nm) |
| 0.3 | 600 | 5 | 5 | 2 |
| 0.5 | 650 | 5 | 10 | 6 |
| 1 | 700 | 5 | 30 | 12 |
| 2 | 750 | 5 | 50 | 25 |
FIG. 2B

| INITIAL THICKNESS OF Ge LAYER (LAYER NO.) ((nm)) | ANNEALING CONDITION | | SIZE OF NANOCRYSTAL | |
|---|---|---|---|---|
| | TEMPERATURE (°C) | TIME (min) | DIAMETER (nm) | HEIGHT (nm) |
| 2 (0.56) | 650 | 20 | 8 | 2 |
| 2 (0.56) | 700 | 10 | 10 | 2 |
| 4 (1.13) | 750 | 10 | 50 | 12 |
| 8 (2.25) | 800 | 5 | 100 | 25 |
FIG. 9
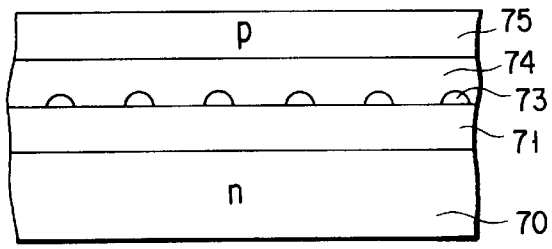
FIG. 10
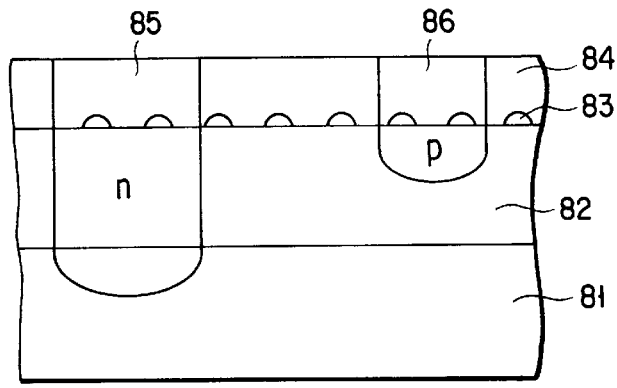
FIG. 11

SEMICONDUCTOR MEMORY DEVICE HAVING MULTILAYER GROUP IV NANOCRYSTAL QUANTUM DOT FLOATING GATE AND METHOD OF MANUFACTURING THE SAME

BACKGROUND OF THE INVENTION

The present invention relates to a semiconductor device having a nanostructure and a method of manufacturing the same.

A structure having a semiconductor nanocrystal formed in the nanometer order can be applied to various types of devices. Many reports have been made on the nanostructure including a manufacturing method thereof. However, most of the techniques thus reported are so specific that they cannot be adapted to conventional semiconductor mass-production processes.

To explain more specifically, nanocrystals are first formed in a gaseous phase by a low pressure CVD or a plasma CVD and then deposited on a substrate which has been cooled at a low temperature in the conventional method. However, the conventional method has a drawback in that particles are generated in a nanoscale device mass production process. Therefore, this method has a poor adaptability to conventionally employed semiconductor processes. In addition, nanocrystals formed in a gaseous phase tend to make a complex on the substrate surface, it is therefore difficult to distribute desired nanocrystals uniformly.

On the other hand, in a conventional large scale integration circuit, a semiconductor device called MOS has been used. Integration level of the MOS has been increased year by year. In 1996, the gate length of a 265-bit DRAM was 0.25 $\mu$m; however, it is estimated that the gate length will be 0.18 $\mu$m in a 1 G-bit DRAM in 2000 and 0.13 $\mu$m in a 4 G bit DRAM in 2005. In this manner, the miniaturization of the DRAM is accelerated.

Whereas, a currently-used miniaturization technique using photolithography has a limit in reducing the size. Numerous problems exist in a so-called post-photographic technology such as electron beam (EB) exposure and an X-ray lithography.

When light exposure is made by the EB device emitting an electron beam with a radius of 10 nm-order, the resultant processing limit is at least 50 nm due to a resolution limit intrinsic to a resist material.

When the minimization processing is made by X-rays, a synchrotron radiation method is usually employed. The synchroton radiation method requires an immense investment in plant and equipment. Nonetheless, a production efficiency can not be improved in proportion to the immense investment. Hence, it is considered unrealistic to put the X-ray minimization technique in practical use. In addition, the X-rays are harmful to human health due to radiation.

For the reasons mentioned above, it is considered so far difficult to attain the mass production of a semiconductor device having a gate length of 0.05 $\mu$m (50 nm) or less.

On the other hand, a nanoscale device called a single-electron device has been studied with the view toward miniaturizing the device. The nanoscale device has a sufficiently small capacitance C. When charging energy ($e^2/(2C)$) stored in a tunnel junction is sufficiently larger than temperature fluctuation (almost equal to KT), that is, ($e^2/(2C)$)>kT, tunneling of electrons is suppressed. This phenomenon is caused by so-called "coulomb blockade". The coulomb blockade provides a threshold in current-voltage characteristics. Because of the presence of a threshold as well as a low power consumption, many application ideas for the single-electron device have been proposed including a three terminal transistor and a memory.

To exercise the coulomb blockade effect and to operate the single-electron device at a room temperature as a general device, it is necessary to form a small tunnel junction having about aF ($10^{-18}$ farad) in terms of a capacitance value.

It has been confirmed that the coulomb blockade effect exercises at a room temperature by using a specific method shown in the papers of IEDM'93-541 (Yano et al), IEDM'94-938 (Takahashi et al.) and the like. However, it is very difficult to manufacture such a small tunnel junction by the currently-used general semiconductor manufacturing technology.

Since the coulomb blockade effect is confirmed to be obtained at a room temperature in practice, the coulomb blockade is expected as a novel technique capable of being incorporated in an LSI circuit. However, the conventional single-electron device and a manufacturing method thereof have the following problems, so that it has not yet been actually applied to an LSI device.

(1) A generally employed LSI manufacturing process including a lithographic method employing a photomask has a limit in miniaturization. Therefore, it is difficult to manufacture such a small capacitance sufficient to observe the coulomb blockade at a high temperature.

(2) In the coulomb blockade, the tunnel barrier defining essential tunneling characteristics has hitherto been significantly limited by the manufacturing method. Therefore, it is difficult to manufacture single-electron devices each having different characteristics depending upon applied circuits.

(3) The tunnel junction through which electrons tunnel in the general single-electron device is formed by using an insulating material such as an oxide film or a material having a high energy barrier in a band diagram. Since the energy barrier is high for electrons, a tunneling probability of an electron itself will exponentially decrease if the thickness of the energy barrier is not reduced. It is therefore necessary to control the thickness of the oxide film very precisely. This makes it more difficult to manufacture a uniform device.

BRIEF SUMMARY OF THE INVENTION

A first object of the present invention is to provide a method of manufacturing a semiconductor nanocrystal, which can be readily incorporated in a semiconductor mass production process, and to provide a semiconductor device formed by the method.

A second object of the present invention is to provide a method of manufacturing a semiconductor device, in particular, a MOS type device, having a gate length of 50 nm or less, mass-produced, and having no harmful effect on human health.

A third object of the present invention is to provide a method of manufacturing a single-electron device having a nanoscale gate length and which is excellent in controllability.

To attain the aforementioned objects, the semiconductor device according to a first aspect of the present invention comprises:

a semiconductor substrate;

a first insulating layer formed on the semiconductor substrate;

at least one double-deck semiconductor nanocrystal formed on the first insulating layer, the at least one double-deck semiconductor nanocrystal comprising a first semiconductor nanocrystal and a second semiconductor nanocrystal stacked one upon the other with a second insulating layer interposed therebetween; and a third insulating layer selectively formed on the first insulating layer so as to cover the at least one double-deck semiconductor nanocrystal.

It is desirable that the double-deck semiconductor nanocrystal have a diameter of 50 nm or less.

A semiconductor device according to a first aspect of the present invention further comprises:

a conductive layer formed on the third insulating film and having at least two sides facing each other, a pair of doped regions formed so as to sandwich the conductive layer in a surface of the semiconductor substrate and along the two sides of the conductive layer, facing each other.

It is desirable that the first and the second insulating layer be a silicon oxide film and the first and the second semiconductor nanocrystal be one of a silicon crystal and a germanium crystal.

A semiconductor device according to a second aspect of the present invention comprises:

a semiconductor substrate;

a first gate insulating film formed in a predetermined region on the semiconductor substrate;

a plurality of semiconductor nanostructures of 50 nm or less in diameter, formed on the first gate insulating film;

a second gate insulating film formed on the first gate insulating film, the plurality of semiconductor nanostructures being embedded in the second gate insulating film;

a gate electrode formed on the second gate insulating film; and a pair of doped layers formed along the gate electrode in the semiconductor substrate with the gate electrode sandwiched therebetween;

wherein each of the plurality of semiconductor nanostructures comprises at least two semiconductor nanocrystals which are divided into an upper portion and a lower portion with an interlayer insulating film interposed therebetween.

It is desirable that each of the first gate insulating film and the interlayer insulating film be a silicon oxide film, and each of the at least two semiconductor nanocrystals be one of a silicon crystal and a germanium crystal.

In the semiconductor device according to a second aspect of the present invention, ease of current flow between the source and drain (a pair of doped layers) varies by movement of electrons toward an upper portion or toward a lower portion. The ease of the current flow can be detected as a change in threshold voltage of a MOSFET. The movement of the electrons between the upper portion and the lower portion of the double-deck nanocrystal can be controlled by a polarity of voltage to be applied to the gate electrode. A nanocrystal memory is realized by using this phenomenon.

A semiconductor device according to a third aspect of the present invention comprises:

a first silicon layer of a first conductive type;

a second undoped silicon layer formed on the first silicon layer;

a plurality of germanium nanocrystals of 100 nm or less in diameter, formed on the second silicon layer;

a third undoped silicon layer formed on the second undoped silicon layer so as to embed the plurality of germanium nanocrystals therein; and a fourth silicon layer of a second conductive type formed on the third undoped silicon layer.

The semiconductor device according to the third aspect provides a light emitting diode by making use of a germanium quantum confinement structure formed on a silicon crystalline substrate.

A method of manufacturing the semiconductor device according to a fourth aspect of the present invention comprises the steps of:

forming a IV-group atomic layer formed of one of an amorphous layer and a polycrystalline layer, on a substrate in a thickness of 0.3 nm or more and 5 nm or less at a low temperature of 500° C. or less; and forming hemispherical nanocrystals by heating the IV-group atomic layer at a high temperature of 600° C. or more and 850° C. or less to agglomerate the IV-group atomic layer, thereby forming hemispherical nanocrystals of 50 nm or less in diameter. The hemispherical nanocrystals are each formed of the IV group atom in a discrete form and distributed two-dimensionally.

It is desirable that the substrate be formed of a silicon oxide film and the IV-group atomic layer be formed of silicon.

The substrate may be formed of a silicon oxide film and the IV-group atomic layer be formed of germanium.

The step of forming the IV-group atomic layer may include the steps of:

forming a band-form silicon oxide layer of 100 nm or less in width on a silicon substrate, and depositing a silicon layer formed of one of an amorphous layer and a polycrystalline layer on the silicon oxide film at a low temperature of 500° C. or less in a thickness ranging from 0.5 to 5 nm.

The step of forming the hemispherical nanocrystals may comprise a step of agglomerating the silicon layer at a high temperature ranging from 730 to 850° C. to form a plurality of silicon nanocrystals aligned in line on the band-form silicon oxide film.

The method of manufacturing the semiconductor device according to the forth aspect uses the agglomeration phenomenon of the amorphous or polycrystalline layer, obtained when the layer is reduced in thickness. As a result, nanoscale crystals can be formed orderly.

A method of manufacturing a semiconductor device according to a fifth aspect of the present invention comprises the steps of:

forming a thin germanium crystalline layer having 8 atomic layers or less on a silicon substrate;

agglomerating the thin germanium layer by heating at 600 to 800° C. to form a plurality of germanium nanocrystals of 100 nm or less in diameter;

forming a silicon crystalline layer on the silicon substrate and embedding the plurality of germanium nanocrystals, after the step of agglomerating the german layer.

According to the method of manufacturing the semiconductor device of the fifth aspect, a nanoscale germanium quantum confinement structure is attained.

The method of manufacturing a semiconductor device according to a sixth aspect of the present invention comprises the steps of:

forming a first oxide film of a first IV-group element on a substrate containing the first IV-group atom;

forming a first layer containing the first IV-group element on the first oxide film;

forming a second oxide film of the first IV-group element on the first layer;

forming a second layer of a second IV-group element formed of one of an amorphous layer and a polycrystalline layer on the second oxide film at a low temperature of 500° C. or less in a thickness from 0.3 nm or more and 5 nm or less;

heating the second layer at 600 to 850° C. to agglomerate the second layer, thereby forming a plurality of nanocrystals of 50 nm or less in diameter formed of the second IV-group element; and removing the second oxide film and the first layer other than portions thereof which lie under the plurality of nanocrystals, by using the plurality of nanocrystals as a mask.

It is desirable that the first IV-group element be silicon, and the second IV-group element be one of silicon and germanium.

According to the method of manufacturing a semiconductor device according to the sixth aspect of the present invention, it is possible to form nanoscale double-deck nanocrystals orderly by making use of the agglomeration phenomenon of the amorphous layer or the polycrystalline layer when it is reduced in thickness.

According to the first to sixth aspects of the present invention, it is possible to provide a method of forming a nanoscale semiconductor crystal on a semiconductor substrate by making use of a process having a high adaptability to a conventional semiconductor mass production process, and to provide a nanoscale structure. Furthermore, high performance light emitting diodes, semiconductor lasers, memory devices, and the like are attained by using the nanoscale structure of the present invention.

The semiconductor device according to a seventh aspect of the present invention comprises:

a semiconductor substrate;

a gate electrode formed on the semiconductor substrate with a gate insulating film interposed therebetween, the gate electrode being formed of agglomerated conductors of 50 nm or less in diameter and being aligned continuously in a band form; and a first and a second doped region formed on the semiconductor substrate along both sides of the band-form gate electrode so as to sandwich the gate electrode.

The method of a semiconductor device according to an eighth aspect of the present invention comprises the steps of:

implanting particles so as to cross an insulating film formed in a device region on a semiconductor substrate, thereby forming a plurality of damaged portions on a surface of the insulating film;

forming agglomerated conductors of 50 nm or less in diameter around the plurality of damaged portions, each serving as a nucleus, on the insulating film to connect the plurality of agglomerated conductors in a band-form.

The step of forming a plurality of agglomerated bodies may include a step of uniformly growing a material having a larger surface migration than that of the insulating film, on the insulating film, followed by agglomerating the material by heating.

According to the manufacturing method of the eighth aspect of the present invention, after the insulating film (oxide film) is damaged by the electron beam (EB) or the like, silicon is allowed to grow epitaxially. Silicon growth is initiated from the damaged portion in the initial process of the crystal growth. Although the size of the crystal varies depending upon how long the crystal growth is required, the crystals in the form of dot (50 nm or less) can be formed orderly.

In the MOS type semiconductor device, the gate oxide film is first formed on the portion in which a gate electrode is to be formed. Then, an electron beam is injected at an interval of several tens of nanometers. Thereafter crystals are allowed to grow as mentioned above. The size of dots is determined in accordance with the interval between the electron beams injected, thereby forming a band of silicon dots. Subsequently, an end of the silicon dot band is connected to a generally-used electrode pad. As a result, a three-terminal MOSFET having a gate length determined depending upon the size of dots (a semiconductor device of the seventh aspect).

Since a resist is not used in this process, the gate length is not limited by a resolution limit intrinsic to the resist material. Hence, controllability in processing is improved. In addition, unlike X-rays, no large equipment space is required. No harmful effects on human health exist. Therefore, this process is excellent as a manufacturing technique.

The semiconductor device according to a ninth aspect of the present invention comprises:

a plurality of protrusions each having a diameter of 50 nm or less formed so as to surround a predetermined region on a semiconductor substrate;

a gate electrode formed in the predetermined region including a surface of the plurality of protrusions, with a gate insulating film interposed therebetween;

a first and a second doped semiconductor layer facing each other with the predetermined region sandwiched therebetween; and an inversion layer formed in the predetermined region among the plurality of protrusions when voltage is applied to the gate electrode.

A method of manufacturing a semiconductor device according to a tenth aspect of the present invention comprises the steps of:

forming a plurality of damaged portions by accelerated particles in a first insulating film formed on a semiconductor surface;

forming an amorphous layer formed of a group-IV element at a low temperature of 500° C. or less in a thickness of 5 nm or less;

heating a resultant structure at 60° C. or more to agglomerate the amorphous layer around the damaged portion, with each serving as a nucleus, thereby forming a plurality of agglomerated conductors of 50 nm or less in a discrete form on the first insulating film; and etching away the first insulating film using the plurality of agglomerated conductors as a mask, thereby forming an electrode layer over an entire surface with a second insulating film interposed therebetween.

The step of forming a plurality of agglomerated conductors may include the step of uniformly growing a material having a larger surface migration than that of the insulating film, on the insulating film, followed by agglomerating the material by heating.

In the semiconductor device (single-electron device) of the ninth aspect of the present invention, the island portion, which requires a nanoscale structure in order to control the number of electron charges accurately, is formed of an inversion layer region between silicon nanocrystals formed by UHV-CVD after damage is caused by an electron beam.

In this method, the size of the island is determined by both the interval between silicon nanocrystals around the island and the size of the silicon nanocrystal generated by UHV-CVD. Conventionally, the size of the island is limited by a lithographic processing limit.

In the present invention, provided that the interval between the silicon nanocrystals around the island is determined by the lithographic processing limit and that the size of silicon nanocrystals is controlled by UHV-CVD, the dimensions of the inversion-layer island finally formed can be reduced much smaller than those obtained by the currently-used lithographic processing.

In the present invention, the tunnel barrier is present at a narrowed portion between silicon nanocrystals, which connects either between the island portion and the source or between the island portion and the drain. This portion does not have the barrier of a potential height as is in the oxide film. Therefore, it is easy to control a tunneling probability relative to processing size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A–1C are cross-sectional views of a semiconductor substrate for showing manufacturing steps of a silicon nanocrystal according to Embodiment 1 of the present invention;

FIGS. 2A and 2B are views showing the relationship between the annealing conditions and the size of the obtained nanocrystal with respect to the initial thickness of the amorphous layer, in the method of manufacturing a nanocrystal according to Embodiment 1, FIG. 2A being a case of silicon and FIG. 2B being a case of germanium;

FIG. 9 is a view showing the relationship between the annealing conditions and the size of the nanocrystal with respect to the initial thickness of a germanium layer in the method of manufacturing a germanium nanocrystal of Embodiment 4;

FIG. 10 is a cross-sectional view of a light-emitting diode having the germanium nanocrystal according to Embodiment 5 of the present invention therein;

FIG. 11 is a cross-sectional view of a light-emitting diode having the germanium nanocrystal according to Embodiment 6 of the present invention therein;

DETAILED DESCRIPTION OF THE INVENTION

Figure 3A:
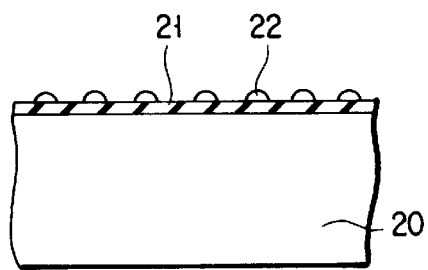
FIGS. 3A–3C are cross-sectional views of a MOS type semiconductor device according to Embodiment 2 of the present invention, for showing the manufacturing steps thereof.

Now, Embodiments of the present invention will be explained with reference to the accompanying drawings.

(Embodiment 1)

FIGS. 1A–1C show a method of manufacturing a semiconductor device according to Embodiment 1 of the present invention. In Embodiment 1, a silicon nanocrystal is formed on a silicon substrate whose surface is thermally oxidized.

First, an oxide film 11 (100 nm thick) is formed on a silicon substrate 10 having a <100> orientation (FIG. 1A). Subsequently, the substrate is introduced in an ultra high vacuum (UHV) CVD apparatus, in which an amorphous silicon layer 12 (1 nm thick) is deposited without heating the substrate (FIG. 1B).

To deposit the amorphous silicon layer 12, an $Si_2H_6$ gas is used herein as a source material. The source material gas molecule is thermally decomposed by an auxiliary heater arranged at a position above the substrate placed in the CVD apparatus, and then supplied to the substrate. In this manner, a silicon thin film can be formed at a room temperature in which the source material is not usually decomposed on the substrate surface. The UHV-CVD apparatus used in the present invention is detailed in Jpn. Pat. Appln. KOKAI No. 7-245236.

The amorphous silicon thin film (1 nm thick) formed by this method is extremely flat. The device to be used in forming the amorphous thin film is not limited to the UHV-CVD apparatus explained in this embodiment. For example, if the thin film is formed either by a molecular beam epitaxy (MBE) method in which a solid silicon material is heated by an electron beam and then supplied to the substrate, or by a plasma CVD method in which a gaseous source material molecule is decomposed by a plasma discharge and then supplied to a substrate, the similar nanocrystal can be formed. The thin film is not always amorphous. If the polycrystalline silicon thin film is employed, the same results can be obtained.

An important problem to be overcome herein is to suppress impurities such as oxygen from being introduced into an initial thin film layer. When the initial silicon layer is contaminated with oxygen, the silicon atoms are suppressed from migrating, preventing agglomeration. In particular, when the initial silicon layer is formed on a substrate by an LPCVD method, in which the thin film is formed by decomposing raw-material atoms by increasing a substrate temperature, there is a high possibility that the interface between the substrate and the silicon layer will be contaminated with a large amount of oxygen.

In this embodiment, the substrate temperature is set to a room temperature when silicon thin film is deposited. However, the substrate temperature may be increased within the range in which oxygen contained in an oxide film of the substrate does not react with the silicon to be deposited. If the substrate temperature is 500° C. or less, the silicon reacts with oxygen on the substrate surface at a low rate. However, when the raw-material silicon is supplied from a source of a high temperature such as a heater for use in decomposing the source material molecule, the substrate temperature is desirably set at 300° C. or less.

Subsequently, the formed thin film is heated at 800° C. without being exposed to the atmosphere, (therefore the surface of the thin film is not oxidized). To be more specific, the substrate is heated for 3 minutes in a ultra high vacuum by the steps of forming an amorphous thin film by UHV-CVD, turned off the auxiliary heater for decomposing raw-material molecule, and increasing a temperature of a substrate heating heater. The heating causes an agglomeration phenomenon in the amorphous silicon formed flat on the thermal oxide film. As a result, the amorphous silicon layer is converted into independent-form crystals 13 (10 nm in diameter at most and about 5 nm in height (FIG. 1C)). That is, silicon nanocrystals are formed on the thermal oxide film.

The density of the silicon nanocrystals formed on the substrate is $3.5 \times 10^{11}/cm^3$. This means that the silicon atoms of the initial amorphous silicon layer are converted into the nanocrystals on the substrate by mass-transfer of the silicon atoms without being vaporized and left into a gaseous phase. In this case, if the time for heating the substrate is increased, the single nanocrystal grows. If the annealing is continued, silicon atoms react with oxygen contained in the oxide film on the substrate and leave the substrate, with the result that the nanocrystal disappears.

In this case, it is possible to control the size of the nanocrystals to be formed by controlling the deposition thickness of the initial amorphous silicon thin film and a heating temperature for causing the agglomeration. More specifically, if the thickness of the initial amorphous layer is set at 0.5 nm and a heating temperature is set at 730° C., the nanocrystal having a 5 nm diameter at most and 2 nm in height can be obtained. In this case, if the thickness of the initial amorphous layer is 0.5 nm or less, silicon atoms react with the oxide film when the annealing is performed at a high temperature (800° C. or more), with the result that the silicon atoms are partially dissociated, delaying agglomeration. Then, the relationship between the annealing conditions (temperature, time) and the size of the nanocrystal with respect to a thickness of the initial amorphous layer, is shown in FIG. 2A.

In the foregoing, we have explained the case where the silicon nanocrystal is formed by depositing an amorphous silicon layer on the oxide film and then heating it. Similarly, a germanium nanocrystal may be formed by depositing an amorphous germanium layer on the oxide film and then heating it. In the case of germanium, the agglomeration is initiated at a lower temperature, than silicon. Hence, the relationship between the annealing conditions and the size of the obtained nanocrystal with respect to the thickness of the initial amorphous layer is as shown in FIG. 2B.

When a sufficiently-thick amorphous silicon layer is heated under such conditions that the surface of the amorphous silicon layer is not oxidized, it is known that a flat surface is transformed into a mushroom-form agglomeration since surface migration of the silicon atoms occurs. However, the agglomeration phenomenon caused when the thickness of the amorphous layer is reduced is the fact found for the first time by the present inventors. Furthermore, the present inventors found that it is important to have a weak interaction between the amorphous layer and the underlying layer in order to form discrete-form (standalone) nanocrystals.

The substrate employed in this embodiment is a silicon substrate whose surface is thermally oxidized. However, any substrate (for example, silicon nitride film) may be used as long as it can be heated at a high temperature without mixing of silicon with oxygen. Note that it is necessary that the surface migration of the deposited material is larger than the surface migration of the material forming the substrate, in order to cause agglomeration. If patterning is made on thin films formed of different types of materials from that of the substrate, it is possible to control the position and size of the nanocrystals in accordance with the patterning.

If agglomeration is caused by the aforementioned steps of depositing the amorphous silicon on the oxide film and heating it, a silicon atom contained in the nanocrystal may react with oxygen contained in the substrate depending upon the heating conditions, with the result that the nanocrystal disappears. However, such a phenomenon occurs specifically when the oxide-film is formed on the substrate. In the case where a substrate (e.g., silicon nitride film) containing no oxygen is used, the aforementioned phenomenon cannot occur. Hence, if a substrate having a nitride film partially made on an oxide-film is employed, the nanocrystals can be formed exclusively on the nitride film while dissipating the nanocrystals formed on the oxide film.

(Embodiment 2)

FIG. 3 is a cross-sectional view showing a method of forming a semiconductor device according to Embodiment 2 of the present invention. Embodiment 2 relates to a device using the nanocrystal shown in Embodiment 1.

First, a silicon nanocrystal is formed on a silicon substrate 20 (surface orientation: <100>) having a thin thermal oxide film 21 (about 3 nm thick or less) in accordance with the method of Embodiment 1 (FIG. 3A). Then, an initial amorphous layer (0.5 nm thick) is formed while the substrate temperature is maintained at a room temperature, and thereafter the substrate temperature is increased to 730° C., in the same manner as in Embodiment 1. As a result, nanocrystals 22 (5 nm in diameter and 2 nm in height) are formed on a thermal oxide film 21.

Figure 3B:
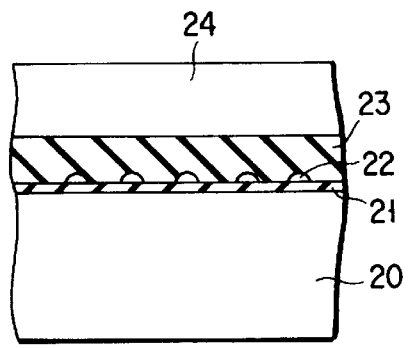

Thereafter, a silicon oxide film 23 is deposited on the resultant structure and further a poly crystalline silicon layer 24 is deposited thereon by a CVD method. A schematic cross-sectional view of the laminate structure thus formed is shown in FIG. 3B. The structure consists of the silicon crystal substrate 20, the silicon oxide film layer 23 containing the thermal oxide film 21 and the silicon nanocrystals 22, the polycrystalline silicon layer 24 laminated in the order mentioned from the bottom.

Figure 3C:
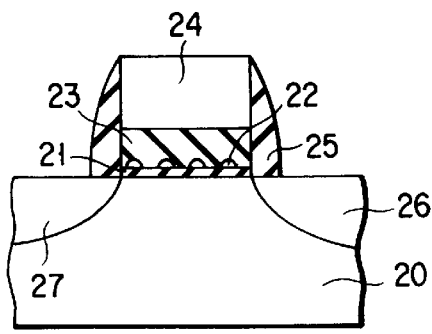

Then, the oxide film layer 23 and the polycrystalline layer 24 are respectively processed into a gate size to form a gate oxide film and a gate electrode. Thereafter, source/drain regions 26, 27 are formed in a well-known method. As a result, a MOSFET structure is formed (FIG. 3C).

In the MOSFET structure, the silicon nanocrystals 22 are present in the gate oxide film 23. It is therefore expected that the MOSFET can be operated differently from a conventional MOSFET. To explain more specifically, if an electric charge is injected into the silicon nanocrystal from the substrate side, a threshold voltage of the MOSFET operation can be changed. Since an amount of charge accumulated per nanocrystal is small, the small change of charge accumulation is captured as a change in threshold voltage of the MOSFET. Hence, The MOSFET thus constructed can be used as a memory device.

Figure 4:
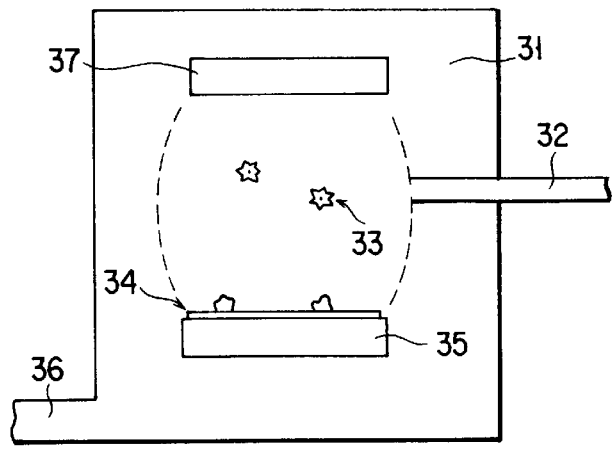
FIG. 4 is a schematic view of a plasma CVD apparatus for explaining problems in manufacturing the similar semiconductor device to that according to Embodiment 2 by conventional technique.

The MOSFET structure similar to the aforementioned one containing silicon nanocrystals can be formed by using a conventional technique such as a plasma CVD method. However, various problems arise. FIG. 4 shows a schematic view of an apparatus for forming a silicon nanocrystal by the conventional technique. A gaseous raw-material molecule containing silicon atoms such as monosilane or disilane is introduced in a vacuum chamber 31 and decomposed in the gaseous phase by generating a plasma discharge.

At this point, if the partial pressure of the source material molecule is set at an appropriate value, the silicon atoms generated by the decomposition reaction performed in the gaseous phase are combined to each other to form nanocrystals 33. These nanocrystals are deposited on a substrate 34 cooled at a low temperature, thereby arranging the silicon nanocrystals on a predetermined substrate. In FIG. 4, the apparatus has a gas inlet 32, a susceptor 35, a gas outlet 36, and an upper electrode 37.

When a substrate temperature is high in the aforementioned manufacturing method, the nanocrystals arriving at the substrate surface react to each other to form a large crystal. It is therefore difficult to control the size of the nanocrystals. Generally, in most cases, the substrate is kept at a low temperature in a sink cooled by liquid nitrogen or the like.

The step of cooling the semiconductor substrate to a room temperature or less is not employed in a general semiconductor manufacturing process. Therefore, it has a poor adaptability to the conventional manufacturing process. In addition, an unnecessarily large amount of fine particles are generated in the gaseous phase. The generation of particles is the primary cause of decreasing a yield in the semiconductor manufacturing process. Therefore, this cooling step does not adapt to a mass production process.

In the conventional method for depositing nanocrystals generated in the gaseous phase on the substrate surface, the generated nanocrystals arrive at the substrate at random. As a result, the nanocrystals are arranged on the surface at random intervals. There is a high probability of the formation of a complex consisting of a plurality of nanocrystals. In addition, the conventional method for arranging semiconductor nanocrystals generated in the gaseous phase, on the substrate cooled at a low temperature has a problem in that the nanocrystals to be deposited on the substrate has a poor adhesion characteristics to the substrate.

Figure 5A:
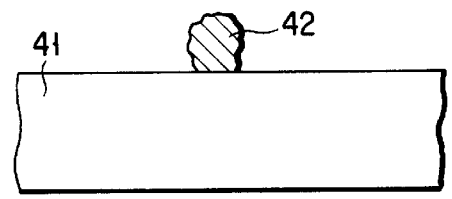
FIG. 5A is a cross-sectional view of a silicon nanocrystal formed by the CVD apparatus of FIG. 4.

FIG. 5A is a schematic cross-sectional view of a nanocrystal 42 mounted on a substrate 41 in accordance with a conventional method. In this case, a nearly spherical nanocrystal is adhered to the substrate. When a different type of film is deposited on the nearly spherical nanocrystal mounted to the substrate; more specifically, a silicon oxide film 44 is deposited by a CVD method as mentioned in the previous Embodiment, there is a high possibility that a "seam" 43 is formed between the coating film 44 and the substrate 41 (FIG. 5B).

The nanocrystal complex mentioned above is a cause of the "seam" generation. The seam thus generated explodes or shrinks in a later heating step, breaking the structure around the seam. Such a problems induce a fatal defect particularly in a manufacturing process for a highly integrated semiconductor device, reducing the yield thereof.

On the other hand, in the method of the present invention including the agglomeration step, the uniformly deposited layer causes agglomeration. It is therefore possible to arrange the nanocrystals on the substrate fundamentally uniformly. Under the circumstance, individual nanocrystals rarely make a complex, which is a main cause of seam generation. Furthermore, since the nanocrystals tightly adhere to the substrate, it is possible to drastically decrease the generation of the seam.

Figure 5B:
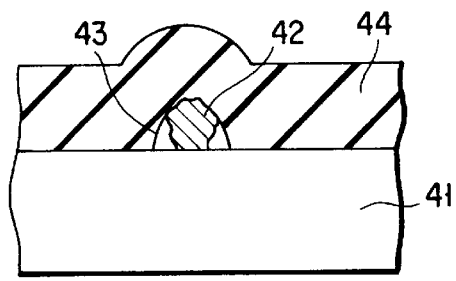
FIG. 5B is a cross-sectional view of a silicon nanocrystal of FIG. 5A covered with an insulating film, for explaining problems associated with this structure.
Figure 6:
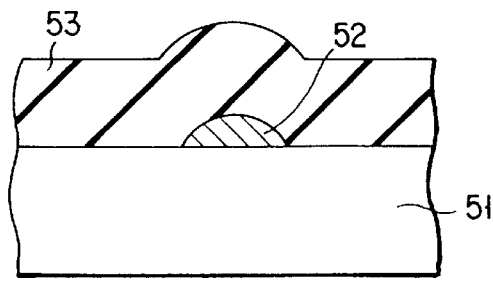
FIG. 6 is a cross-sectional view of a silicon nanocrystal formed by the method of the present invention and covered with an insulating film.

FIG. 6 shows another example of the same structure as in FIG. 5B in accordance with the method of the present invention. Reference numerals 51, 52, and 53 are a silicon substrate, a nanocrystal, and a silicon oxide film, respectively. There is no seam shown in FIG. 6.

(Embodiment 3)

Figure 7A:
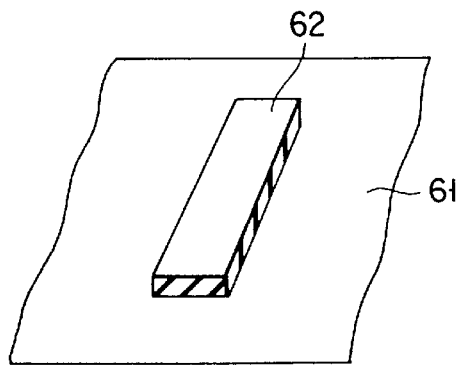
FIGS. 7A and 7B are perspective views for explaining a method of manufacturing a silicon nanocrystal according to Embodiment 3 of the present invention.
Figure 7B:
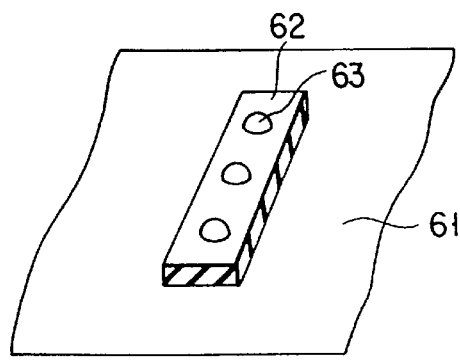

FIG. 7B is a perspective view showing a structure of a semiconductor device according to Embodiment 3 of the present invention. Embodiment 3 is another application example of the semiconductor nanocrystal of the present invention.

First, a divided region 62 (1 μm long, 100 nm wide, and 20 nm thick) formed of a silicon oxide layer is previously prepared on a silicon crystalline substrate (FIG. 7A). The silicon oxide region 62 is formed by a conventionally employed method including the steps of thermally oxidizing the entire surface of the substrate, and patterning the resultant substrate in a photo-etching process.

On the substrate thus processed, then silicon nanocrystals are formed in accordance with the method shown in Embodiment 1. In this case, the initial amorphous silicon layer is deposited so as to be formed in a thickness of 2 nm while setting a substrate temperature at a room temperature. Thereafter, the substrate is heated to 830° C. to form nanocrystals 63 of 30 nm in diameter. At this point, a region other than the oxide film region 62 (the region in which silicon crystals are exposed), the deposited amorphous silicon is converted into a homogeneous flat layer to the underlying silicon layer by heating.

When agglomeration takes place by heating in the amorphous silicon layer deposited on the divided oxide film region 62, silicon atoms migrate to a silicon crystalline portion outside the silicon oxide region 62 near the boundary of the silicon oxide region 62; whereas, the silicon atoms present in the inner region far from the boundary come together at a center of the silicon oxide region 62 to form nanocrystals 63.

In the case where the width of the silicon oxide region 62 is not sufficiently wide to the size of the nanocrystal 63 generated by the agglomeration, as is in this embodiment, it is possible to position the nanocrystal 63 at the center of the region. Consequently, it is possible to obtain a structure having nanocrystals 63 aligned in the center of the oxide film region 62, as shown in FIG. 7B.

As described above, a method of arranging nanocrystals 63 in line in the divided oxide film can be arbitrarily controlled by appropriately combining factors such width (size) of the oxide film region 62, a thickness of the initial amorphous layer to be deposited, a heating temperature for agglomeration, and the like.

In this embodiment, the oxide film is used as the region in which agglomeration takes place. However, a silicon nitride film or the like may be used in the same way as in Embodiment 1.

(Embodiment 4)

Figure 8A:
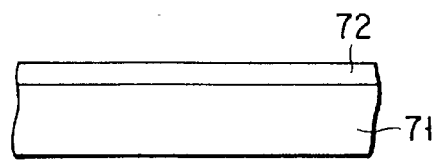
FIGS. 8A–8C are cross-sectional views for explaining a method of manufacturing a germanium nanocrystal according to Embodiment 4 of the present invention.
Figure 8B:
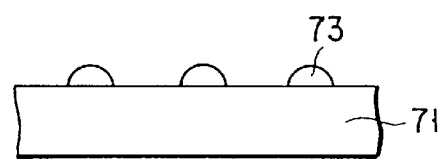
Figure 8C:
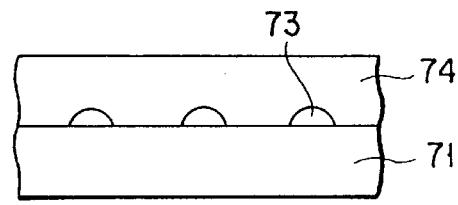

Now, we will explain an embodiment for forming a germanium quantum confinement structure on a silicon crystalline substrate. FIG. 8 is a cross-sectional view showing basic steps of forming the quantum confinement structure according to Embodiment 4.

A germanium thin-film crystalline layer 72 of 4 atomic layers (1.23 nm thick) is formed on a silicon substrate 71 of a <100> surface orientation. In this embodiment, the germanium thin-film crystals are formed by thermal decomposition of a $GeH_4$ gas molecules on the substrate surface of 500° C. by use of a UHV-CVD apparatus (FIG. 8A).

When the germanium crystalline layer is formed on a silicon crystalline substrate, distortion occurs between the germanium crystal layer and the silicon crystalline substrate, especially when the thin film layer gets thick. As a result, it is known that generation of dots are is observed. However, when the germanium thin layer is formed in a thickness of 4 atomic layers or less under the temperature conditions used in this embodiment, the obtained thin-film crystalline layer is excellent in flatness. In the case of 8 atomic layers, initial flatness is lower compared to the case of the 4 atomic layers. However, the size of dots obtained by agglomeration described below is well regulated.

After formation of the germanium thin-film crystalline layer, heating is continuously performed at 750° C. for 10 minutes. As a result, the flat germanium thin-film layer is converted into nanocrystals 73 by the agglomeration due to heating. Nanocrystals of 50 nm in diameter and 12 nm in height are formed under the conditions mentioned above (FIG. 8B).

Then, the substrate temperature is set again at 600° C. A silicon crystalline layer 74 (200 nm thick) is grown by using $Si_2H_6$ as a source material. At this time, the shape of the germanium nanocrystal does not change. Hence, when the germanium nanocrystal portion is sandwiched by the silicon crystals, the quantum confinement structure is attained.

Also in this embodiment, it is possible to control the size of the nanocrystals by the thickness of the germanium thin-film layer initially formed and the heating temperature for agglomeration. To be more specific, if the germanium thin layer is formed of 2 atomic layers and heated at 700° C., the size of the nanocrystals obtained is 10 nm in diameter and 2 nm in height. The sizes of the nanocrystals formed under various conditions are shown in the table of FIG. 9. Temperatures of 650° C. or more are listed with respect to 2 atomic layers shown in FIG. 9. However, the size of the crystal does not change in a broad temperature range below 650° C. To explain more specifically, the nanocrystal obtained even at 600° C. has the similar size to one obtained at 650° C.

It is easier in practice to employ a method in which the germanium crystalline thin film layer initially formed flat at a low temperature, is heated at a high temperature to agglomerate the IV-group atomic layer. However, it is possible to obtain the nanocrystals by employing a method in which a germanium source material is supplied onto a silicon substrate previously heated at a high temperature. For example, if the germanium source material is supplied onto a silicon substrate heated at 750° C., nanocrystals of about 170 nm can be formed.

In this embodiment, the silicon layers containing no dopants are employed as the layers sandwiching germanium nanocrystals. However, the germanium nanocrystalline layer may be sandwiched by the layers doped with p- and n-impurities. If a pn junction is formed in this way and electric current is injected into germanium quantum dots, a light-emitting diode can be formed. Next, an example of the light-emitting diode will be explained.

(Embodiment 5)

FIG. 10 is a cross-sectional view of the light emitting diode formed by the germanium dot formation method of Embodiment 4. Like reference numerals are used to designate like structural elements corresponding to those in embodiment 4 and any further explanation is omitted for brevity's sake.

In this embodiment, a silicon layer 71 (5 nm thick) containing a dopant is formed on an n-type substrate 70 containing a phosphorus as dopant by the UHV-CVD method. Furthermore, germanium quantum dots 73 are formed in accordance with Embodiment 4. On the resultnat structure, a silicon layer 74 (5 nm thick) containing no dopant and a p-type silicon layer 75 containing boron as the dopant are successively formed, thereby forming a light-emitting diode.

The germanium quantum dots play a main part of the light emitting portion. If the size of the quantum dot is 10 nm at most, emission light extending from red to infrared is observed.

(Embodiment 6)

FIG. 11 shows another embodiment of a light-emitting diode formed by the germanium dot forming method of Embodiment 4.

A first silicon layer 82 (5 μm thick) without a dopant is formed on an n-type silicon substrate 81. Then, germanium dots 83 are formed on the first silicon layer 82 by the method of Embodiment 4. Subsequently, a second silicon layer 84 (1 μm thick) containing no dopant is formed on the resultant structure. N-type impurity ions are injected from the surface of the resultant structure to form an n-type region 85. Thereafter, P-type impurity ions are injected to form a p-type region 86. A p-i-n juction is formed in this way. A light-emitting diode is completed.

In this method, since a generally-employed silicon mass production process is employed except the germanium dot formation step, a large number of light emitting diodes can be formed on a large diamter silicon wafer. In addition, the diodes can be easily integrated and combined with other elements.

(Embodiment 7)

FIGS. 12A–12D are cross-sectional views showing the steps of forming the light-emitting diode according to Embodiment 7. In this embodiment, a germanium quantum dot region is formed by a selective growing method on an n-type silicon substrate having a silicon oxide film patterned thereon.

Figure 12A:
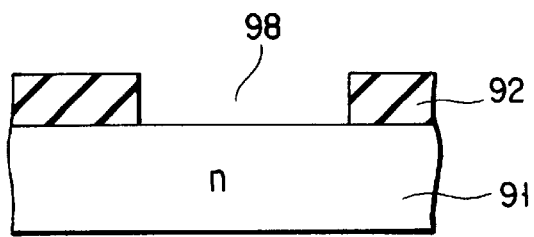
FIGS. 12A–12D are cross-sectional views showing the manufacturing steps of a light-emitting diode having a germanium nanocrystal according Embodiment 7 of the present invention therein.
Figure 12B:
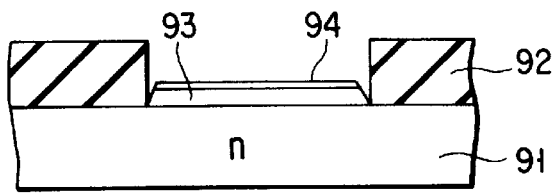

As shown in FIG. 12A, an opening 98 (10 nm diameter) is formed through a thermal oxide film 92 (100 nm thick) on an n-type substrate 91. Then, a silicon layer 93 (10 nm thick) is grown in the opening 98 by the selective growing method. Furthermore a germanium layer 94 of 1.5 atomic layers is formed on the silicon layer 93 similarly by the selective growing method (FIG. 12B).

Figure 12C:
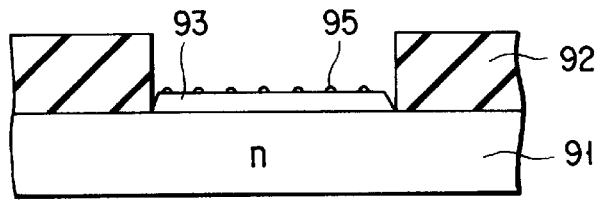
Figure 12D:
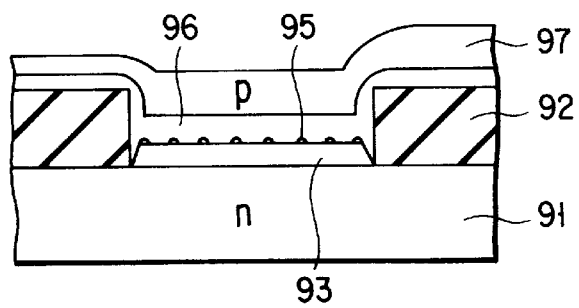

Thereafter, the resultant structure is heated at a high temperature of 700° C. to form a germanium nanocrystal 95 (FIG. 12C). After a silicon layer 96 (10 nm) is grown by a non-selective growing method, a silicon layer 97 containing a p-type dopant is formed. In this way, a pin diode structure is accomplished (FIG. 12D).

The light-emitting diode portion is thus formed in a region surrounded by the silicon oxide film, thereby forming a light confinement structure making use of difference a in refractive indexes. In addition, this structure is extremey advantageous since it is formed by applying a conventional silicon process. Furthermore, a waveguide can be formed by making use of the shape of the peripheral oxide film or in combination with other material, through a conventionally-used semiconductor process.

(Embodiment 8)

Figure 13:
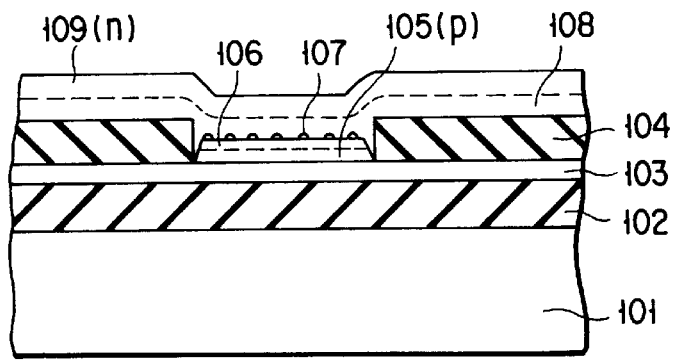
FIG. 13 is a cross-sectional view of a surface light-emitting laser having a germanium nanocrystal according to Embodiment 8 of the present invention therein.
Figure 14A:
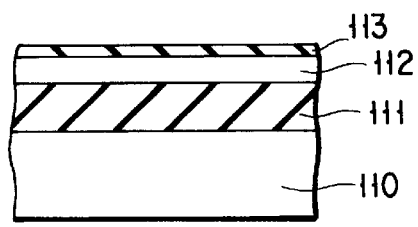
FIGS. 14A–14D are cross-sectional views showing manufacturing steps of a double-deck nanocrystalline structure according to Embodiment 9 of the present invention.

FIG. 13 is a cross-sectional view of a surface emitting laser according to Embodiment 8. In this embodiment, the structure of Embodiment 7 is formed on an SOI substrate. It is therefore easy to isolate devices and to confine light also in the vertical direction of the substrate. If light is taken out from the substrate surface, it is possible to form a surface emitting laser in which plural devices are integrated.

An SOI substrate having a p-type silicon layer (SOI layer) 103 of a 150 nm thick is formed on a silicon substrate 101 with a silicon oxide film 102 (500 nm thick) interposed therebetween. Then, a thermal oxide film 104 (200 nm thick) is formed on the surface of the resultant substrate. At this point, the SOI layer 103 is left unoxidized by 50 nm.

Subsequently, an opening (1 μm×250 μm) is formed in the thermal oxide film surface to expose the underlying SOI layer 103. As a result, a silicon layer can be grown only on the exposed SOI layer.

Then, a thin silicon layer (100 nm) is formed on the exposed SOI layer by a selective growing method. In this case, boron is doped as a dopant in the lower portion (50 nm) of the thin silicon layer. This is named as a p-type layer 105. The upper portion (50 nm) of the thin silicon layer containing no dopant is named as a silicon layer 106.

The germanium thin film of 3 atomic layers is formed on the resultant structure by the method of Embodiment 4, followed by heating at a high temperature to convert the germanium thin film into germanium dots 107. The typical size of the germanium dots is 10 nm. Since the germanium gas molecules are decomposed only on the silicon crystal in the method of the present invention, dots are not formed on the oxide film.

On the resultant structure, a silicon thin film (400 nm) is further grown. This silicon thin film is grown in a non-selective manner. Therefore, the silicon thin film is also formed on the oxide film. A lower layer (50 nm) of the silicon thin film (400 nm) is a no-dopant containing layer 108. The upper layer thereof (350 nm) is a layer 109 highly doped with arsenic.

As a result, a pin structure is formed around the layer containing germanium quantum dots 107, providing a diode capable of current injection. If the diode is strongly excited, a laser can be emitted.

The layer containing germanium quantum dots 107 is surrounded by the oxide film layer 104 previously prepared, it is possible to confine light. In addition, it is effective that a portion of the oxide film 104 corresponding to a light emitting portion thereof, is removed to expose the silicon layer 103 and then the exposed portion is thermally oxidized again.

Generally, a compound semiconductor laser makes use of a cleavage plane to form a cavity. In the structure of this embodiment, since the thermal oxide film which has a good adaptability to the silicon crystal can be used, it is not necessary to employ the cleavage-plane formation step which exhibits poor adaptability to a mass-production process for the nanostructure.

(Embodiment 9)

Now will be explained a semiconductor device having two silicon nanocrystals which are stacked with a tunnel oxide film interposed therebetween. FIGS. 14A–14D are cross-sectional views showing the steps of manufacturing the semiconductor device.

A polycrystalline silicon layer 112 (5 nm thick) is formed on the first oxide film 111 (7 nm thick) on a semiconductor substrate 110. However, the polycrystalline silicon layer 112 is not necessarily formed of a polycrystalline material. Even if an SOI substrate having a thin crystalline silicon layer is used, the same process is employed thereafter and the same effect is produced.

Subsequently, an oxide film 113 (1.5 nm) is formed on the surface of the polycrystalline silicon layer 112 (FIG. 14A) by a generally employed oxide-film formation method. In this manner, the polycrystalline silicon layer 112 is obtained in a thickness of about 4.8 nm. The oxide film 113 may be deposited by a CVD method.

Figure 14B:
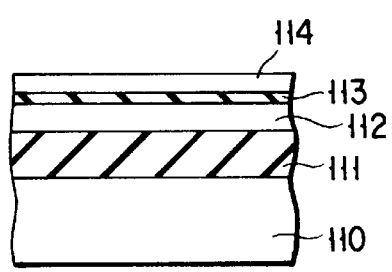

Subsequently, an amorphous silicon layer 114 (1 nm thick) is formed on the oxide film 113 (FIG. 14B). It is desired that the amorphous silicon layer be formed at a low temperature of 500° C. or less. In other words, it is desired that the layer characteristics change sharply between the oxide film 113 (tunnel oxide film) and the silicon layer 114 formed on the oxide film 113.

Figure 14C:
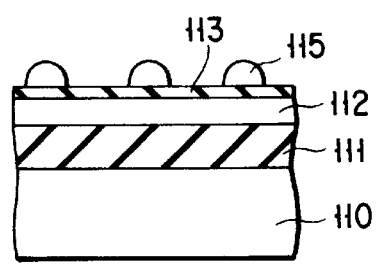

After the amorphous silicon layer 114 is formed, the processed substrate is heated at 800° C. The heating induces agglomeration of the uppermost amorphous silicon layer 114 to form nanocrystals 115 (about 10 nm diameter) (FIG. 14C). More specifically, when the initial amorphous silicon layer (1 nm) is heated at 800° C. for 3 minutes, it is possible to form hemispherical silicon nanocrystals of 10 nm in diameter.

It is desired that steps following the step of forming the polycrystalline silicon layer 112 or, more preferably, the step of forming the lowermost oxide film 111 be performed continuously in the same treatment chamber without being exposed to the atmosphere. This is because if exposed to the atmosphere, a native oxide film is formed on the surface of the polycrystalline silicon layer 112, with the result that the oxide film 113 cannot be formed in a designed thickness. This is also because when the amorphous silicon layer 114 is heated and agglomerated, the surface of the amorphous silicon layer 114 must not be oxidized. Moreover, it is important that the layer characteristics change sharply between the silicon layer 114 and the oxide film 113, as described above.

Subsequently, the substrate is taken out from a film formation apparatus. Etching is then performed using the formed silicon nanocrystals 115 as a mask. Dry etching or wet etching may be employed herein. Prior to etching, a native oxide film formed by exposing it to the atmosphere and the upper oxide film layer formed on the polycrystalline silicon layer 112 are removed. Thereafter, the polysilicon layer 112 is etched away.

In the etching step, the silicon nanocrystals 115 used as a mask are etched more or less simultaneously. However, if the etching rate is controlled, it is possible to leave at least a part of the silicon nanocrystal particles 115 obtained by the agglomeration and the polycrystalline silicon layer 112 which is formed under the silicon nanocrystal particles 115. In this embodiment, the polycrystalline silicon layer is etched using the silicon nanocrystals (10 nm in initial diameter obtained immediately after agglomeration) as a mask. As a result, the resultant polysilicon nanocrystals have a diameter of 3 nm. It is therefore possible to leave the polycrystalline layer under the nanocrystals.

When the polycrystalline silicon layer is etched, the etching can be terminated at the oxide film under the polycrystalline silicon layer by employing a method having a selectivity to an oxide film. In this case, however, it is necessary to repeat different etching steps alternately, for removing the surface oxide film and for removing the polycrystalline silicon layer.

Figure 15:
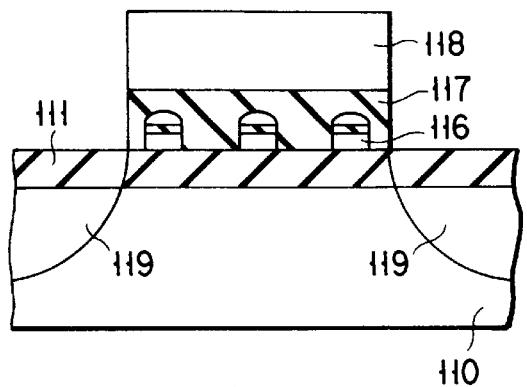
FIG. 15 is a cross-sectional view of a memory device having the double-deck nanocrystalline structure according to Embodiment 9 of the present invention therein.
Figure 14D:
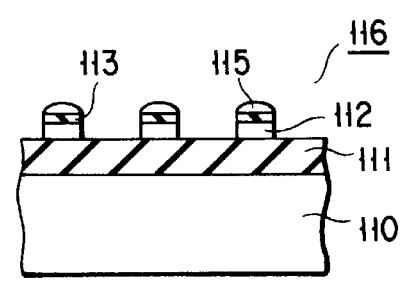

In the aforementioned method, it is possible to form a double-deck nanocrystal 116 in which silicon nanocrystals are stacked one upon the other on the oxide film (FIG. 14D). It is therefore possible to form a memory device as shown in FIG. 15 by making use of the double-deck nanocrystals 116 thus formed.

To form the memory device, an oxide film 117 (25 nm) is first formed on the substrate including the double-deck nanocrystals by a CVD method, thereby embedding the double-deck nanocrystals 116 in the oxide film 117. After the oxide film 117 is deposited, a polycrystalline silicon layer 118 is formed and processed into a gate electrode. Further, a source/drain region (dopant injection region) 119 is formed, thereby accomplishing a nanocrystal memory including the double-deck nanocrystals. If the double-deck nanocrystals are used as a floating gate, it is possible to obtain a memory capable of being operated minutely.

Now, will be explained operation of the nanocrystal memory shown in FIG. 15.

First, a strong electric field is applied between the substrate 110 and the gate electrode 118 so that the gate electrode is positively charged. Then, a tunnel current flows through the gate oxide film and electrons are thus accumulated in the lower portions of the double-deck nanocrystals 116. The electrons once accumulated in the double-deck nanocrystals are confined within an oxide film barrier, so that if level of the electric field between the substrate and the gate electrode is reduced, the electrons are rarely released and retained within the barrier. When voltage is applied between the source and drain while the electrons are being accumulated at the lower portions of the double-deck nanocrystals, the electric current between the source and the drain is suppressed by the electric field generated by the presence of electrons accumulated at the lower portions of the nanocrystals.

Next, a weak electric field is applied between the gate electrode and the substrate so that the gate electrode is positively charged. Then, the electrons present at the lower portions of the double-deck nanocrystals move to the upper portions of the double-deck nanocrystals. In this case, since the upper portion is isolated from the lower portion of each of the double-deck nanocrystals by the tunnel oxide film, the electrons stay at the upper portions of the double-deck nanocrystals even if the electric field applied between the gate electrode and the substrate is released. In this state, the electric field to be applied to the channel is weakened as compared to the case where electrons are accumulated at the lower portions of the double-deck nanocrystals. Hence, the electric current easily flow when voltage is applied between the source and the drain.

In other words, since electrons move from the upper portions to the lower portions of the double-deck nanocrystals respectively and vice versa, the current flowability between the source and drain changes. This phenomenon can be detected as a change in a threshold voltage of a MOSFET. The electron movement between the upper and the lower portions of the double-deck nanocrystals can be controlled by the polarity of the voltage to be applied to the gate electrode.

In a conventionally-used nanocrystal memory, the memory is retained by maintaining electrons introduced into the nanocrystals through the gate oxide film from a channel. If electrons are easily introduced into the nanocrystals, writing can be made easily and quickly. If electrons are tightly retained in the nanocrystals, memory data can not be changed easily. These contradicted phenomena must be traded off.

On the other hand, the gate oxide film between the double-deck nanocrystals and the channel is formed relatively thick (7 nm) in this invention. Therefore, the electrons once confined in the double-deck nanocrystals can be stably retained. Furthermore, an ON/OFF operation is made by movement of the electrons between through the thin tunnel oxide films in the double-deck nanocrystals. As a result, the high-speed operation can be attained.

(Embodiment 10)

Figure 16A:
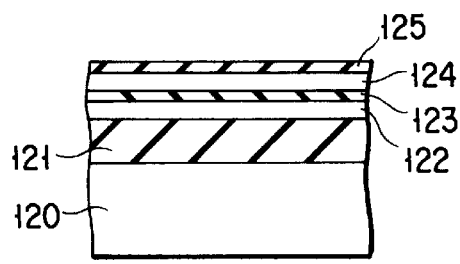
FIGS. 16A–16C are cross-sectional views showing manufacturing steps of a triple-deck nanocrystalline structure according to Embodiment 10 of the present invention.
Figure 16B:
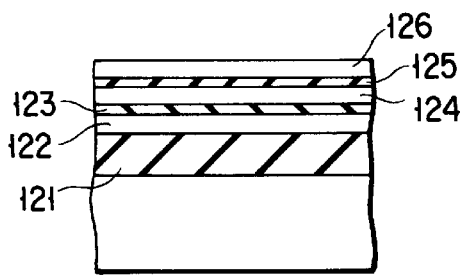
Figure 16C:
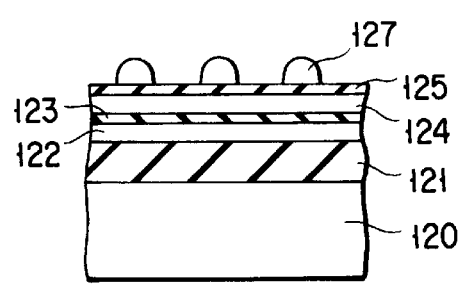
Figure 17:
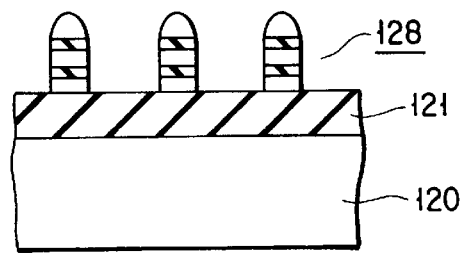
FIG. 17 is a cross-sectional view of a finished product having the triple-deck nanocrystalline structure according to Embodiment 10 of the present invention therein.

FIGS. 16A–16C are cross sectional views showing the steps of forming triple-deck nanocrystalline structure according to Embodiment 10 of the present invention. FIG. 17 is a cross-sectional view of a finished triple-deck nanocrystalline structure of this embodiment.

A first polycrystalline silicon layer 122 (5 nm thick) is formed on a first oxide film 121 on a semiconductor substrate 120. On the resultant structure, a second oxide film 123 (3 nm thick) and a second polycrystalline silicon layer 124 (5 nm) are formed in the order mentioned, and finally a third oxide film 125 (3 nm) is formed as the uppermost layer (FIG. 16A).

Next, an amorphous germanium layer 126 (1 nm thick) is deposited on the third oxide film 125 (FIG. 6B). The following process is substantially the same as in Embodiment 9. The resultant structure is subjected to a heat treatment without exposing the amorphous germanium layer 126 to the atmosphere. As a result, germanium nanocrystals 127 are formed by the agglomeration phenomenon (FIG. 16C). In this case, the germanium nanocrystals have a diameter of 10 nm.

As a next step, the underlying oxide films 125, 123 and the polycrystalline silicon layers 124, 122 are etched using the germanium nanocrystals 127 as a mask (FIG. 17). When the underlying polycrystalline silicon layers are etched using the germanium nanocrystals as a mask, etching is made at a high selective ratio thereto. Hence, even if a plurality of the underlying silicon layers are present, etching can be made. In this method, the triple-deck nanocrystalline structure 128 by superposing three nanocrystals one upon another with a thin oxide film interposed in each interface thereof, as shown in FIG. 17.

Figure 18A:
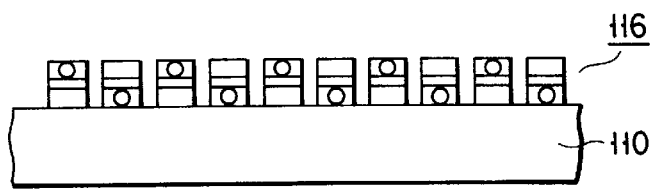
FIGS. 18A and 18B are schematic cross-sectional views for explaining an applied example of the double-deck nanocrystalline structure of the present invention.
Figure 18B:
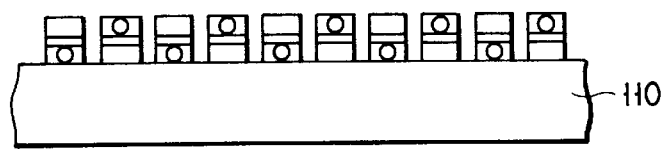

FIGS. 18A and 18B show an application example of the double-deck nanocrystalline structure. A plurality of the double-deck nanocrystals each being divided by a thin oxide film are aligned in line on a substrate 110. Electric charges are injected into either one of the double-deck nanocrystals. If the charges are injected in the same side portions of the adjacent double-deck nanocrystals in line, for example, injected in both upper side portions or both lower side portions, it is difficult to retain the injected charges due to repulsion force of the charges. As a result, the charges are retained, for example, in an upper side of a first one and in a lower side of a second one of the adjacent nanocrystals. When a plurality of double-deck nanocrystals are aligned, the charges are retained alternately in an upper side and in a lower side (FIG. 18A).

In this case, if the charge retained portion is reversed at the nanocrystal placed at the end of line, the charge retained portion of the adjacent nanocrystal is automatically reversed. In this reversal phenomenon is transmitted sequentially on line (FIG. 18B). If the charge retained portion of the nanocrystal positioned at an end of the line is reversed in a predetermined period (frequency), the periodical signal can be transmitted sequentially. The signal transmission from a nanocrystal to a nanocrystal looks like as if the signal is transmitted through an electric wire.

Now, embodiments of a semiconductor device having a nanoscale gate electrode structure using the nanostructure of the present invention will be described.

(Embodiment 11)

Figure 19A:
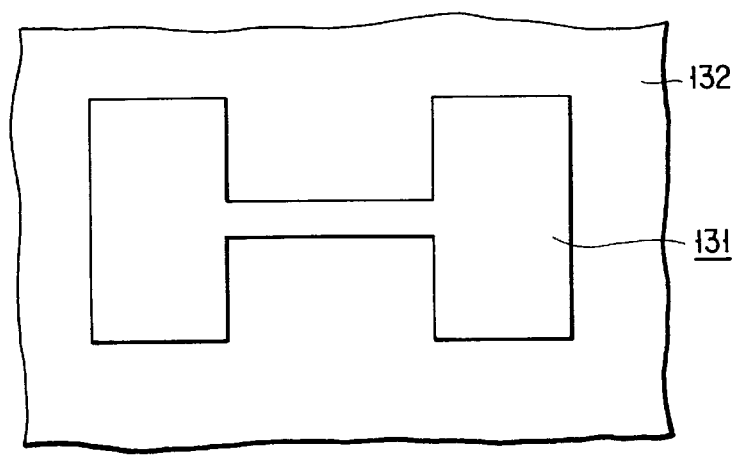
FIGS. 19A and 19B are plan views for explaining a manufacturing method of a MOS type semiconductor device according to Embodiment 11 of the present invention.
Figure 19B:
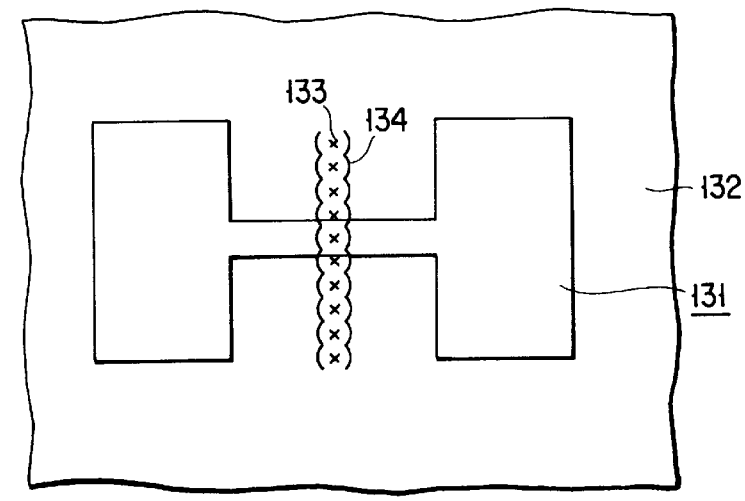
Figure 20:
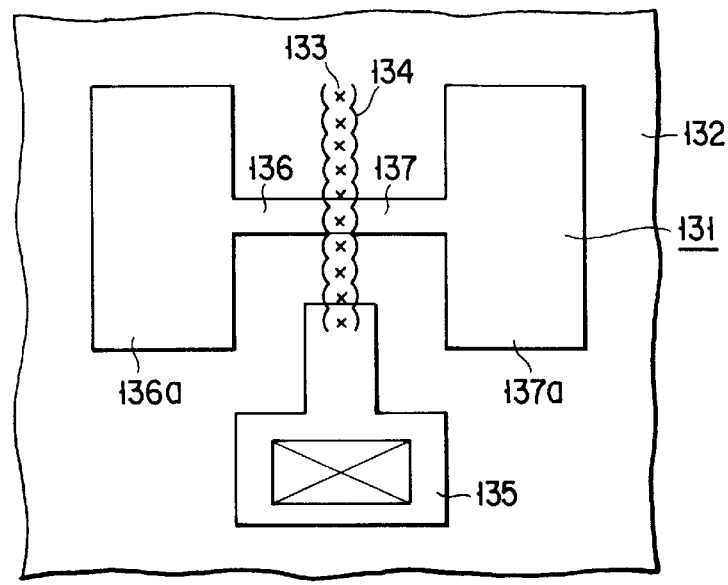
FIG. 20 is a plan view of a finished semiconductor device, showing a next step of that shown in FIG. 19B.

FIGS. 19A, 19B and 20 are schematic plan views of a gate electrode of a MOS semiconductor device according to Embodiment 11 of the present invention. The method of manufacturing the semiconductor device will be explained with reference to the aforementioned figures.

As shown in FIG. 19A, a device isolation region 132 is formed by LOCOS (local oxidation of silicon) so as to surround a device region 131 on a silicon substrate.

After a gate insulating film (not shown) is formed in a portion of the device region 131 on which a gate is to be formed, an electron beam is sequentially irradiated at 20–30 nm intervals. The electron beam is scanned linearly on the substrate, including the LOCOS region, in the gate width direction. As a result, the crystalline structure of the gate insulating film (silicon oxide film) is broken to form damaged portions 133.

Figure 21A:
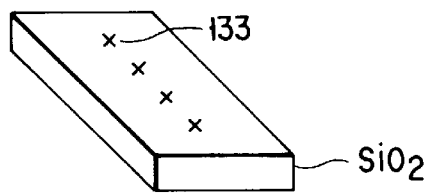
FIGS. 21A and 21B are perspective views for explaining a manufacturing method of a silicon nanocrystal according to Embodiment 11.
Figure 21B:
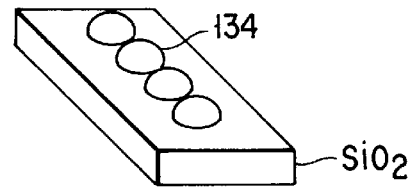

Then, the substrate is introduced in an ultra high vacuum (UHV) CVD apparatus to form amorphous silicon nanocrystal dots 134 without heating the substrate (FIG. 19B). FIGS. 21A and 21B are magnified perspective views of the damaged portion 133 of the gate portion and silicon nanocrystal dots formed on the portion 133, respectively.

In this case, the amorphous silicon is formed from a source material, an $Si_2H_6$ gas. The $Si_2H_6$ gas is thermally decomposed by an auxiliary heater set a position above the substrate surface in the CVD apparatus, and supplied to the substrate. In this manner, an amorphous silicon thin film (5 nm thick) is formed on the substrate surface. The obtained amorphous silicon thin film (5 nm) thus formed is extremely uniform.

When the substrate is subsequently heated at 850° C., the surface migration of the amorphous silicon is larger than that on the silicon oxide film, so that the amorphous silicon shrinks to be converted into dots (25 nm high and 50 nm diameter). Dots are electrically connected to form a band-form gate electrode. According to this method, the silicon nanocrystal can be formed at a temperature at which usually no decomposition of the source material takes place.

A pad 135 for a gate electrode is formed at an end of the resultant silicon nanocrystal band by conventional photolithography. As a result, a gate electrode having a gate length of 50 nm is formed. Then impurity ions are injected in the structure having the gate electrode, thereby increasing an impurity concentration of the device region 131. In this manner, a source region 136 and a drain region 137 are formed respectively on both sides of the gate electrode. Then, a source electrode 136a and a drain electrode 137a are respectively formed on both ends of the source region 136 and the drain region 137. After an upper-layer wiring is formed on the resultant structure with an interlayer insulating film interposed between them, a MOS type semiconductor device is completed.

The present invention can be applied to a step of forming a nanocrystal electrode with respect to all devices to be used in an LSI circuit, as well as a MOSFET using SOI mentioned above.

To form the gate electrode, the present invention makes use of the phenomenon that the silicon nanocrystal having a diameter of 50 nm or less is selectively and orderly formed on the $SiO_2$ film which has been damaged by the electron beam radiation or the like. Therefore, the formation of the gate electrode of the present invention is not restrained by resist characteristics and resolution limit of resist, unlike the normal gate electrode formation method. Furthermore, the method of the present invention makes it possible to form a semiconductor device having a gate length of 10 nm order without drawbacks associated with X-ray lithography, such as large investment in plant and equipment, lack of general versatility, difficulty in handling, and adverse effects to human health.

(Embodiment 12)

FIGS. 22A, 22B–25A and 25B are views sequentially showing the manufacturing steps of a single-electron device according to Embodiment 12 of the present invention. The views indicated by reference numerals attached with suffix A are plan views. The views indicated by reference numerals attached with suffix B are cross-sectional views.

Figure 22A:
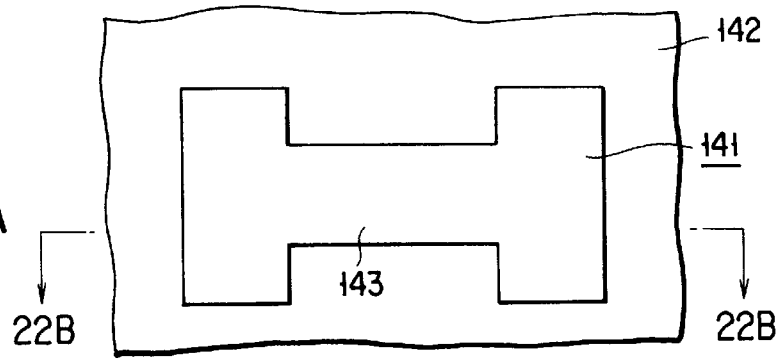
FIG. 22A is a plan view for explaining a semiconductor device according to Embodiment 12 of the present invention.
Figure 22B:
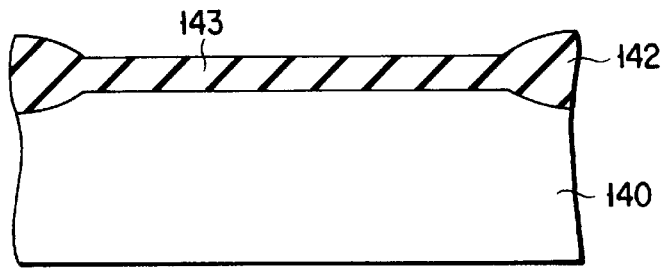
FIG. 22B is a cross-sectional view taken along a 22B—22B line of FIG. 22A.

As shown in FIGS. 22A and 22B, after a device region 141 surrounded by LOCOS 142 is formed on a semiconductor substrate 140, an $SiO_2$ film 143 (about 100 nm thick) is formed on the device region 141 by CVD or oxidation of the entire substrate.

Figure 23A:
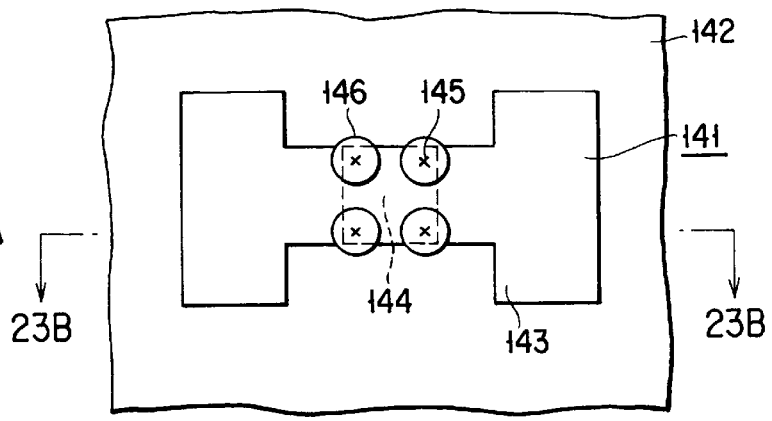
FIG. 23A is a plan view showing a next step of that shown in FIG. 22A.
Figure 23B:
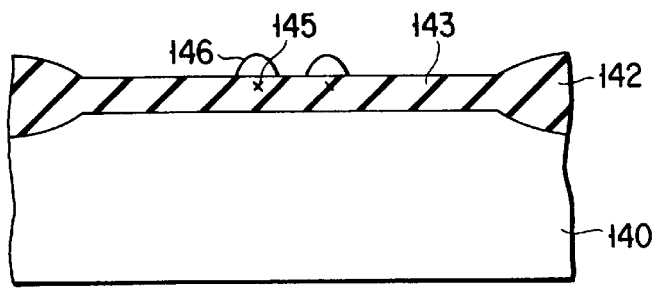
FIG. 23B is a cross-sectional view taken along a 23B—23B line of FIG. 23A.

Then, as shown in FIGS. 23A and 23B, an electron beam or the like is applied onto four points which surround the region 144 forming an island of the single-electron device. In this way, the crystal structure of the oxide film 143 is broken in a dot fashion to form damaged portions 145. Subsequently, the substrate is introduced in the ultra high vacuum (UHV) CVD apparatus. Amorphous silicon nanocrystals 146 are formed without heating the substrate.

An $Si_2H_6$ gas is used as a raw-material to form the amorphous silicon. The source material gas ($Si_2H_6$ gas) is thermally decomposed by an auxiliary heater positioned at a place above the substrate surface placed in the CVD apparatus and then supplied to the substrate. As a result, an amorphous silicon thin film (5 nm or less in thickness) is formed on the substrate surface at a temperature of 300° C. or less.

In this embodiment, the substrate temperature is set at a room temperature when the silicon thin film is deposited. However, the substrate temperature may be increased as long as oxygen contained in the oxide film substrate does not react with silicon to be deposited. If the substrate temperature is 500° C. or less, the reaction between the source material silicon and oxygen present in the substrate surface is suppressed low. However, when the silicon source material is supplied from a high-temperature source such as a heater for decomposing the source material molecules, it is desired to set the substrate temperature at 300° C. or less.

Subsequently, the substrate is heated at 730 to 850° C., the amorphous silicon is shrunk to form independent-form dots of nanocrystals (50 nm or less in diameter) since the surface migration of the amorphous silicon is larger than that of the oxide film.

The nanocrystal is not necessary to be formed of the amorphous material. Elements of the IV group may be used other than silicon. The formation method is not limited to the UHV-CVD method and use may be made of an MBE method in which a solid silicon material is heated by an electron beam and supplied to a substrate, and a plasma CVD method in which a gaseous source material molecule is decomposed by plasma discharge and supplied to the substrate.

The number of damaged portions by the electron beam are not limited to four. Any number of the damaged portions are acceptable as long as the damages portions surround the island. Note that the interval between the damaged portions is set slightly larger than the diameter of the nanocrystal formed later. In this embodiment, for example, the interval is set at 50 to 100 nm.

Figure 24A:
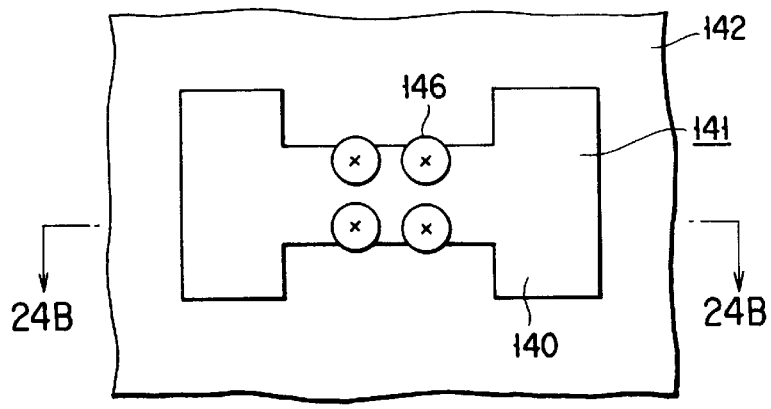
FIG. 24A is a plan view showing a next step of that shown in FIG. 23A.
Figure 24B:
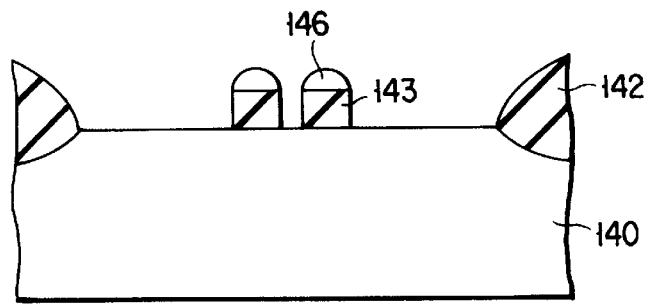
FIG. 24B is a cross-sectional view taken along a 24B—24B line of FIG. 24A.

As shown in FIGS. 24A and 24B, the $SiO_2$ film 143 formed on the device region 141 is etched away with hydrofluoric acid. In this case, since the silicon nanocrystal 146 serves as a mask, the $SiO_2$ film 143 is left under the silicon nanocrystal 146.

Figure 25A:
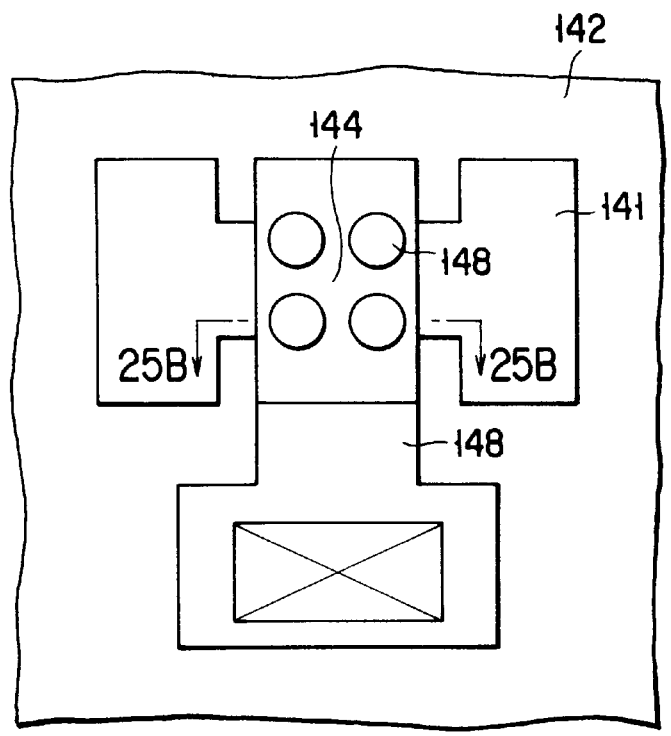
FIG. 25A is a plan view showing a next step of that shown in FIG. 24A.
Figure 25B:
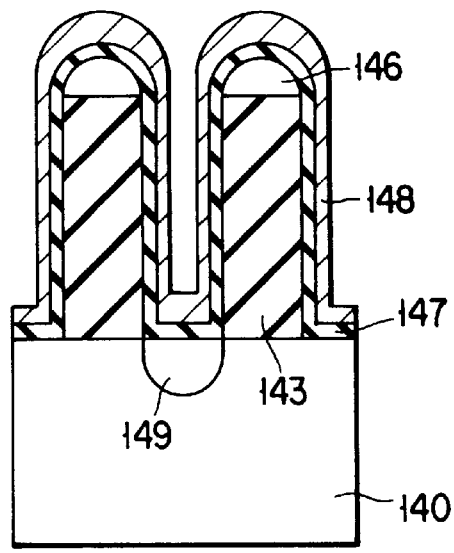
FIG. 25B is a cross-sectional view taken along a 25B—25B line of FIG. 25A.

As shown in FIGS. 25A and 25B, the gate oxidation is applied to the entire device to form a gate oxide film 147 of about 5 nm in thickness. Subsequently, a gate electrode 148 is formed of polysilicon on the region including the island 144. The electrode material used herein is not limited to polysilicon. A metal such as aluminium may be used.

Then, impurity ions are injected in the source and drain regions, increasing an impurity concentration of the source and drain regions. On the resultant structure, an upper-layer wiring is formed with the interlayer insulating film interposed therebetween. As a result, a single-electron device is completed.

Figure 26:
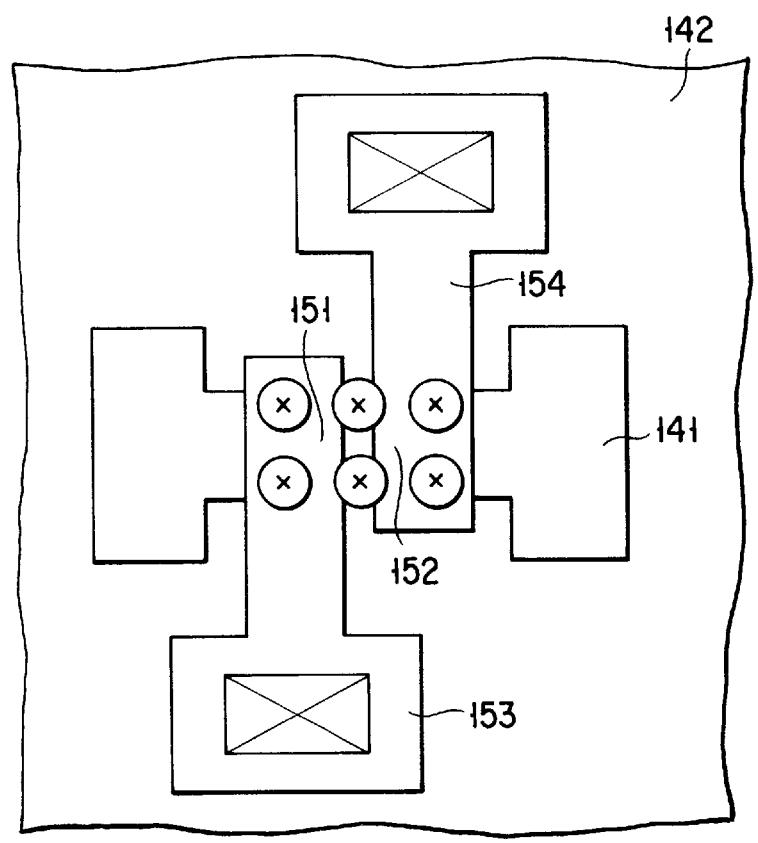
FIG. 26 is a plan view of a modified example of a semiconductor device shown in Embodiment 12, the semiconductor device having two islands in series and gate electrodes respectively belonging to the two islands.

In this embodiment, four silicon nanocrystals are used. A number of silicon nanocrystals may be formed so as to surround the island as mentioned above. In FIG. 26, six damaged portions are formed. The number of islands in which electrons are stored is two as indicated by reference numerals 151 and 152, which are positioned in series in the source/drain direction.

Then, the gate electrodes 153 and 154 are formed respectively controlling the two islands 151 and 152. Therefore, multi-valued logic control is made depending upon the number of electrons stored in the two islands.

Figure 27:
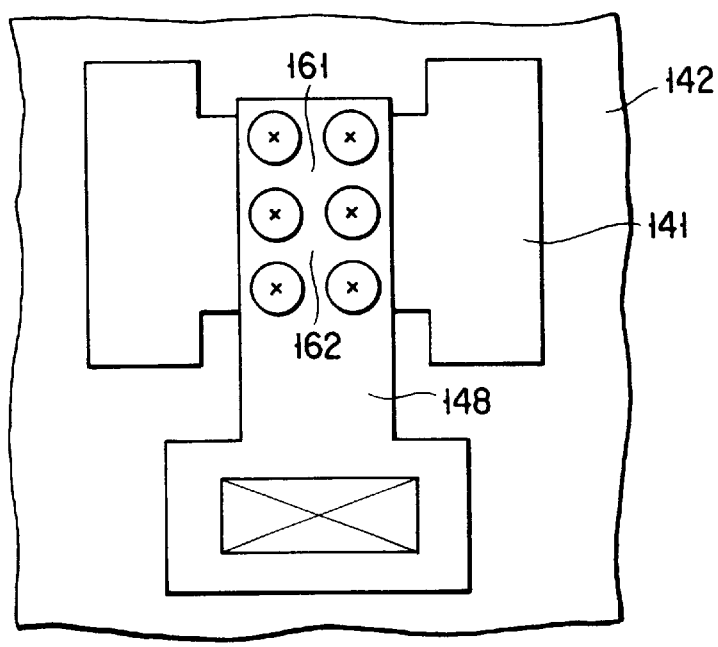
FIG. 27 is a plan view of another modified example of a semiconductor device shown in Embodiment 12, the semiconductor device having two islands in series and a gate electrode common in the two islands.

The islands may be aligned in parallel in the source/drain direction as indicated by reference numerals 161 and 162 in FIG. 27. In this case, the electrons stored in the island is two in total, so that current capacity can be increased.

In the single-electron device of the present invention, an electron beam is applied to damage the region surrounding the island, thereby forming the island portions for storing electron charges. The $SiO_2$ film is etched with hydrofluoric acid using the silicon nanocrystals formed around the damaged portion in the UHV-CVD apparatus, as a mask. As a result, a gate oxide electrode layer and a polysilicon electrode layer are formed.

Therefore, the mask accuracy depends only on the interval accuracy of the damage portions first formed. The size of the charge accumulating island formed as an inversion layer (denoted by reference numeral 149 in FIG. 25B) in the region surrounded by silicon nanocrystals is determined by subtracting the size of the silicon nanocrystal from the area surrounded by the damaged portions. Therefore, it is possible to form an island of a lowermost size or less even by a state-of-art processing technique.

In this embodiment, the diameter of the silicon nanocrystals is set at about 50 nm. As a result, the gate electrode has a length of about 100 nm in the plan view thereof. If the diameter of the silicon nanocrystals is set at 25 nm, the gate may be obtained in a length of about 50 nm.

According to the single-electron device of the present invention, to control the number of electron charges accurately, the island portion required for the nanostructure is used as an inversion layer region between the silicon nanocrystals formed above.

In the present invention, if the interval between the silicon nanocrystals around the island is regarded as a lowermost limit attained by the current lithographic technology, the finally produced inversion layer island can be made much smaller than the lowermost size attained by the currently employed lithographic technology, by controlling the size of the silicon nanocrystals formed by the UHV-CVD. The method mentioned in the foregoing makes it possible to provide the single-electron device capable of being operated at a room temperature and excellent in controllability and reproducibility.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate having a region for forming a current channel;
a first insulating layer formed on the semiconductor substrate;
a plurality of double-deck semiconductor nanocrystals formed on the first insulating layer, each of the double-deck semiconductor nanocrystals comprising a first semiconductor nanocrystal and a second semiconductor nanocrystal stacked upon the first semiconductor nanocrystal with a second insulating layer interposed therebetween; and
a third insulating layer selectively formed on the first insulation layer so as to cover the plurality of double-deck semiconductor nanocrystals,
wherein the second semiconductor nanocrystal has a semispherical surface, and the plurality of double-deck nanocrystals have a same height.

2. The semiconductor device according to claim 1, wherein the double-deck semiconductor nanocrystal has a diameter of 50 nm or less.

3. The semiconductor device according to claim 1, further comprising
a conductive layer formed on the third insulating layer and having at least two sides facing each other,
a pair of doped regions formed so as to sandwich the conductive layer in a surface of the semiconductor substrate and along the two facing sides of the conductive layer.

4. The semiconductor device according to claim 1, wherein the first and second insulating layers are silicon oxide films and the first and the second semiconductor nanocrystals are each either one of a silicon crystal and a germanium crystal.

5. A method of manufacturing the semiconductor device according to claim 1, comprising the steps of:
forming the first insulating layer of a first IV group element on the substrate containing the first IV group element;
forming a first film containing the first IV group element on the first insulating layer;
forming the second insulating layer of the first IV group element on the first insulating layer;
forming a second film of a second IV group element formed of one of an amorphous film and a polycrystalline film on the second insulating layer at a low temperature of 500° C. or less in a thickness falling in a range from 0.3 nm to 5 nm;
heating the second film at 600 to 850° C. to agglomerate the second film, thereby forming a plurality of nanocrystals of 50 nm or less in diameter formed of the second IV group element; and
forming the third insulating layer on a portion of the first insulating layer other than portions thereof which lie under the plurality of nanocrystals and on the plurality of nanocrystals, so as to embed the plurality of nanocrystals.

6. The method of manufacturing the semiconductor device according to claim 5, wherein the step of forming the third insulating layer includes:
a step of removing portions of the second insulating layer and the first film other than portions thereof which lie under the plurality of nanocrystals, using the plurality of nanocrystals as a mask, thereby forming the at least one double-deck semiconductor nanocrystal, and
a step of forming the third insulating layer on the first insulating layer so as to embed the plurality of nanocrystals.

7. The method of manufacturing the semiconductor device according to claim 5, wherein the first IV group element is silicon, the second IV group element is one of silicon and germanium.

8. A semiconductor device comprising:
a semiconductor substrate having a region for forming a current channel;
a first gate insulating film in a predetermined region on the semiconductor substrate;
a plurality of semiconductor nanostructures of 50 nm or less in diameter, formed on the first gate insulating film and having a same height;
a second gate insulating film formed on the first gate insulating film, the plurality of semiconductor nanostructures being embedded in said second gate insulating film;
a gate electrode formed on the second gate insulating film; and
a pair of doped layers formed along the gate electrode in the semiconductor substrate with the gate electrode sandwiched therebetween,
wherein each of the plurality of semiconductor nanostructures comprises at least two semiconductor nanocrystals which are stacked upon one another with an interlayer insulating film interposed therebetween, and
a thinner one of the first gate insulating film and a portion of the second gate insulating film located between an uppermost surface of an uppermost one of the at least two semiconductor nanocrystals and the gate electrode has a thickness larger than four times a thickness of the interlayer insulating film of each of the nanostructures.

9. The semiconductor device according to claim 8, wherein each of the first gate insulating film and the interlayer insulating film is a silicon oxide film, and each of the at least two semiconductor nanocrystals is one of a silicon crystal and a germanium crystal.

10. The semiconductor device according to claim 8, wherein an uppermost portion of each of the plurality of semiconductor nanostructures has a semispherical surface.

11. The semiconductor device according to claim 8, wherein a thicker one of the first gate insulating film and the portion of the second gate insulating film located between the uppermost surface of the uppermost one of the at least two semiconductor nanocrystals and the gate electrode has a thickness larger than ten times a thickness of the interlayer insulating film of each of the nanostructures.

12. The semiconductor device according to claim 11, wherein the thicker one of the first gate insulating film and the portion of the second gate insulating film located between the uppermost surface of the uppermost one of the at least two semiconductor nanocrystals and the gate electrode has a thickness larger than 10.8 times a thickness of the interlayer insulating film of each of the nanostructures.

13. The semiconductor device according to claim 8, wherein the thinner one of the first gate insulating film and the portion of the second gate insulating film located between the uppermost surface of the uppermost one of the at least two semiconductor nanocrystals and the gate electrode has a thickness larger than 4.67 times a thickness of the interlayer insulating film of each of the nanostructures.

* * * * *